(12) United States Patent
Kinoshita et al.

(10) Patent No.: US 9,224,748 B2
(45) Date of Patent: Dec. 29, 2015

(54) METHOD OF FORMING SPACED-APART CHARGE TRAPPING STACKS

(75) Inventors: Hiroyuki Kinoshita, San Jose, CA (US);
Ning Cheng, San Jose, CA (US);
Minghao Shen, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/696,409

(22) Filed: Jan. 29, 2010

(65) Prior Publication Data

US 2010/0187597 A1    Jul. 29, 2010

Related U.S. Application Data

(62) Division of application No. 11/615,365, filed on Dec. 22, 2006, now Pat. No. 7,687,360.

(51) Int. Cl.
*H01L 27/115* (2006.01)

(52) U.S. Cl.
CPC ........ *H01L 27/11563* (2013.01); *H01L 27/115* (2013.01); *H01L 27/11568* (2013.01)

(58) Field of Classification Search
CPC ................... H01L 27/11568; H01L 27/11563; H01L 27/115
USPC .............. 257/314–316, 324, E29.3, E29.309; 438/257
See application file for complete search history.

(56) References Cited

U.S. PATENT DOCUMENTS

| | | | |
|---|---|---|---|
| 6,627,927 B2 | 9/2003 | Wu | |
| 6,649,474 B1 | 11/2003 | Lin et al. | |
| 6,673,677 B2 * | 1/2004 | Hofmann et al. | 438/257 |
| 6,706,595 B2 | 3/2004 | Yang et al. | |
| 6,784,476 B2 | 8/2004 | Kim et al. | |
| 6,803,276 B2 | 10/2004 | Kim et al. | |
| 6,818,558 B1 * | 11/2004 | Rathor et al. | 438/694 |
| 6,927,446 B2 | 8/2005 | Yoshino | |
| 7,196,371 B2 * | 3/2007 | Pan et al. | 257/315 |
| 7,259,423 B2 | 8/2007 | Min et al. | |
| 7,262,093 B2 | 8/2007 | Wang | |
| 7,368,347 B2 * | 5/2008 | Joshi et al. | 438/257 |
| 7,511,334 B2 | 3/2009 | Lee et al. | |
| 7,786,512 B2 * | 8/2010 | Bloom et al. | 257/202 |
| 7,973,366 B2 * | 7/2011 | Ho et al. | 257/365 |
| 2002/0102859 A1 * | 8/2002 | Yoo | 438/758 |
| 2003/0047763 A1 * | 3/2003 | Hieda et al. | 257/288 |
| 2003/0141541 A1 * | 7/2003 | Wu | 257/319 |
| 2003/0151069 A1 * | 8/2003 | Sugimae et al. | 257/200 |

(Continued)

OTHER PUBLICATIONS

Peter van Zant, "Microchip Fabrication," McGraw-Hill, Fifth Edition, 2004, pp. 37.*

(Continued)

*Primary Examiner* — Joseph C Nicely

(57) ABSTRACT

Methods are provided for fabricating memory devices. A method comprises fabricating charge-trapping stacks overlying a silicon substrate and forming bit line regions in the substrate between the charge trapping stacks. Insulating elements are formed overlying the bit line regions between the stacks. The charge-trapping stacks are etched to form two complementary charge storage nodes and to expose portions of the silicon substrate. Silicon is grown on the exposed silicon substrate by selective epitaxial growth and is oxidized. A control gate layer is formed overlying the complementary charge storage nodes and the oxidized epitaxially-grown silicon.

13 Claims, 4 Drawing Sheets

(56) References Cited

U.S. PATENT DOCUMENTS

| | | | |
|---|---|---|---|
| 2003/0222318 A1* | 12/2003 | Tanaka et al. | 257/406 |
| 2004/0121605 A1* | 6/2004 | Maydan et al. | 438/694 |
| 2005/0111279 A1* | 5/2005 | Ogura et al. | 365/222 |
| 2005/0196948 A1 | 9/2005 | Shih | |
| 2006/0011966 A1 | 1/2006 | Wang | |
| 2006/0068546 A1* | 3/2006 | Chang | 438/257 |
| 2006/0121673 A1 | 6/2006 | Lojek | |
| 2006/0157773 A1* | 7/2006 | Yu et al. | 257/314 |
| 2006/0211188 A1* | 9/2006 | Lusky et al. | 438/201 |
| 2006/0240615 A1 | 10/2006 | Shih | |
| 2006/0255399 A1* | 11/2006 | Kim et al. | 257/324 |
| 2006/0264007 A1* | 11/2006 | Lee et al. | 438/478 |
| 2006/0270158 A1* | 11/2006 | Chang et al. | 438/257 |
| 2007/0063259 A1 | 3/2007 | Derderian et al. | |
| 2007/0087482 A1* | 4/2007 | Yeh et al. | 438/120 |
| 2007/0187747 A1 | 8/2007 | Forbes | |
| 2007/0205454 A1* | 9/2007 | Cheung et al. | 257/314 |
| 2008/0048249 A1* | 2/2008 | Tega et al. | 257/326 |
| 2008/0076243 A1 | 3/2008 | Chang | |
| 2008/0083946 A1* | 4/2008 | Fang et al. | 257/324 |
| 2008/0153228 A1* | 6/2008 | Cheng et al. | 438/261 |
| 2008/0217685 A1* | 9/2008 | Kim | 257/344 |
| 2008/0230827 A1* | 9/2008 | Bhattacharyya | 257/317 |
| 2008/0286539 A1* | 11/2008 | Gadkaree | 428/212 |
| 2010/0173465 A1* | 7/2010 | Kamei et al. | 438/299 |
| 2010/0184263 A1* | 7/2010 | Sel et al. | 438/257 |
| 2011/0033636 A1* | 2/2011 | Nishimura et al. | 427/557 |

OTHER PUBLICATIONS

Munkholm et al., "Ordering in Thermally Oxidized Silicon," Physical Review Letters, vol. 93 No. 3, Jul. 16, 2004, pp. 036106-1-036106-4.*

Munkholm et al., "Observation of a Distributed Epitaxial Oxide in Thermally Grown SiO2 on Si(001)," Physical Review Letters, vol. 75 No. 23, Dec. 4, 1995, pp. 4254-4257.*

Munkholm et al., "Remembrance of Things Past," SSRL Science Highlight, Jul. 2004, pp. 1-3, http://www-ssrl.slac.stanford.edu/research/highlights_archive/oxidizedsi.html.*

USPTO Non-Final Rejection for U.S. Appl. No. 11/615,365 dated Jan. 7, 2009; 21 pages.

USPTO Notice of Allowance for U.S. Appl. No. 11/615,365 dated Nov. 2, 2009; 8 pages.

* cited by examiner

METHOD OF FORMING SPACED-APART CHARGE TRAPPING STACKS

CROSS-REFERENCES TO RELATED APPLICATIONS

This Application is a Divisional of U.S. patent application Ser. No. 11/615,365, filed Dec. 22, 2006.

FIELD OF THE INVENTION

The present invention generally relates to semiconductor memory devices and to methods for their fabrication, and more particularly relates to memory devices and methods for fabricating memory devices, especially dual storage node memory devices.

BACKGROUND OF THE INVENTION

A type of commercially available flash memory product is a MirrorBit® memory device available from Spansion, LLC, located in Sunnyvale, Calif. A MirrorBit cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

A portion of an exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bit line regions or bit lines. A charge trapping stack 18 is disposed on the top surface of the substrate between the bit lines. The charge trapping stack 18 typically comprises, for example, a charge trapping layer, often a silicon nitride layer 20, disposed between a first or bottom insulating layer 22, such as a silicon dioxide layer (commonly referred to as a tunnel oxide layer), and a second or top insulating layer 24. A gate electrode 26, which typically comprises an N or N+ polycrystalline silicon layer, is formed over the charge trapping stack. An isolation region or "middle gate insulator" 40 divides the charge trapping stack below each gate electrode 26 to form a first charge storage node or bit 28 and a complementary second charge storage node or bit 30 of memory cells 32 and 34.

As devices densities increase and product dimensions decrease, it is desirable to reduce the size of the various structures and features associated with individual memory cells, sometimes referred to as scaling. However, the fabrication techniques used to produce flash memory arrays limit or inhibit the designer's ability to reduce device dimensions. For longer channel devices, it is not necessary to isolate portions of the charge trapping layer of complementary bits, that is, gate insulators 40 in cells 32 and 34 are not necessary. As device dimensions decrease to 45 nm nodes and smaller, isolation of the charge trapping layer portions of the complementary nodes by middle gate insulator 40 becomes advantageous.

One type of material used to fabricate middle gate insulator 40 is silicon oxide. However, often during formation of the silicon oxide middle gate insulator 40, the thickness of the tunnel oxide 22 proximate to the middle gate insulator increases due to encroachment of the silicon oxide, forming a "bird's beak". This bird's beak results in degrade device performance. The thickness of the middle gate insulator 40 is partially determined by the memory cell operation method. Thinner middle gate insulators (e.g., <10 nm) may be used in the case of hot hole injection erase, while Fowler-Nordheim (FN) tunneling erase requires higher erase fields and therefore thicker middle gate insulators.

Accordingly, it is desirable to provide methods of fabricating semiconductor memory devices that can be scaled with device dimensions. In addition, it is desirable to provide methods for fabricating dual bit memory devices that do not result in increased thickness of the tunnel oxide layer during formation of the middle gate insulator. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

The invention pertains to a semiconductor device including a silicon substrate and first and second insulating elements disposed on the silicon substrate. First and second bit line regions are disposed in the silicon substrate underlying the first and second insulating elements, respectively. First and second charge storage nodes are disposed along a sidewall of the first and second insulating elements, respectively. Oxidized epitaxially grown silicon is disposed on the silicon substrate between the first and second charge storage nodes.

In accordance with another exemplary embodiment of the present invention, a method for fabricating a dual bit memory device includes forming a plurality of multi-layer charge-trapping stacks overlying a silicon substrate. A plurality of impurity-doped bit line regions are formed within the substrate. A plurality of insulating elements are then fabricating such that each of the insulating elements overlies one of the bit line regions. The insulating elements are to be each disposed between two adjacent charge-trapping stacks of the plurality of multi-layer charge-trapping stacks. Sidewall spacers are formed overlying portions of the multi-layer charge-trapping stacks and adjacent to sidewalls of each of the plurality of insulating elements. Portions of the silicon substrate may now be exposed by etching portions of each of the plurality of multi-layer charge-trapping stacks using the sidewalls spacers as etching masks. Silicon is grown on the exposed portions of the silicon substrate by a process of selective epitaxial growth. The epitaxially grown silicon is then oxidized. Finally, a control gate layer is fabricated overlying the multi-layer charge trapping stacks and the oxidized silicon.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with various exemplary embodiments of the present invention, FIGS. 2-11 illustrate method steps for fabricating a dual bit memory device 50 that can be scaled with decreased device dimensions. The methods provide for the isolation of charge trapping layers of complementary charge storage nodes without oxide encroachment into tunnel oxide layers of the charge storage nodes. FIGS. 2-11 illustrate various cross-sectional views of dual bit memory device 50. Various steps in the manufacture of dual bit memory device 50 are well known and so, in the interest of brevity, many conventional steps will only be mentioned briefly herein or will be omitted entirely without providing well known process details.

Figure 1:
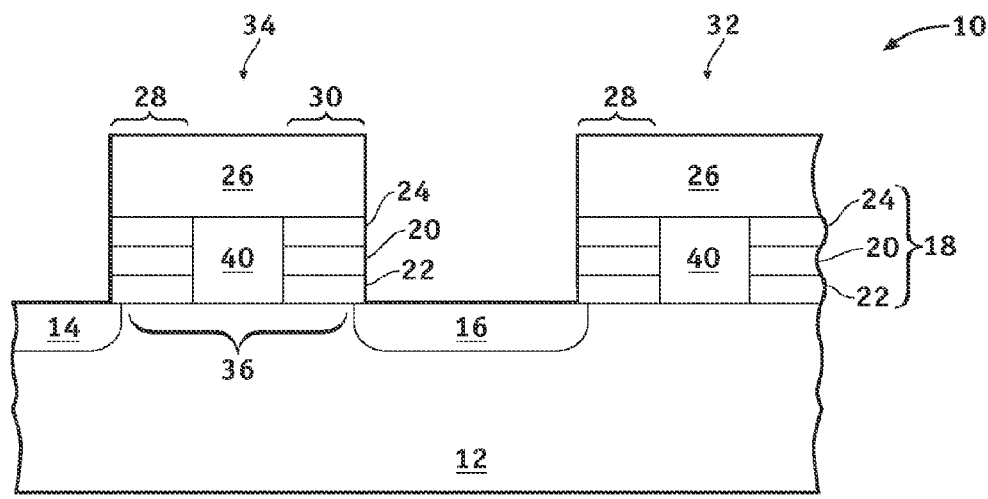
FIG. 1 is a cross-sectional view of a portion of a MirrorBit® dual bit memory device available from Spansion, LLC.
Figure 2:
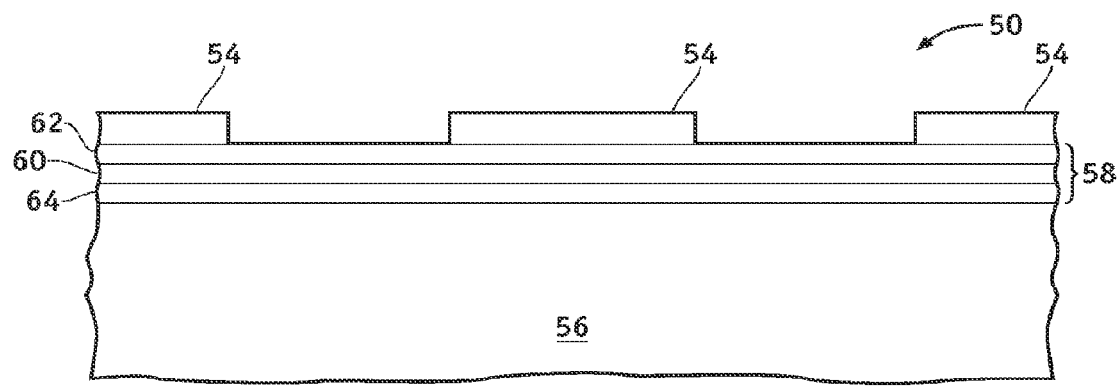
FIGS. 2-11 are cross-sectional views taken along the same axis that illustrate methods for fabricating a dual bit memory device in accordance with exemplary embodiments of the present invention.

As illustrated in FIG. 2, the manufacture of dual bit memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first insulating layer 64 and a charge trapping layer 60 of a multi-layer dielectric-charge trapping-dielectric stack 58 are formed overlying substrate 56. Preferably insulating layer 64 is a layer of silicon dioxide having a thickness of about 2-10 nanometers (nm), more preferably about 5 nm. Layer 64 can be a thermally grown layer of silicon dioxide or can be deposited, for example, by low pressure chemical vapor deposition (LPCVD). Thin insulator layer 64 is often referred to as a tunnel oxide layer, a layer through which programming or erasing charge carriers can tunnel. Charge trapping layer 60 can be, for example, a layer of silicon nitride, silicon-rich silicon nitride, polycrystalline silicon, a combination of these, or any of the other well known charge trapping materials. Stoichiometric silicon nitride is $Si_xN_y$ for which x=3 and n=4; silicon-rich silicon nitride is a silicon/nitrogen material for which x/y is greater than 3/4. Charge trapping layer 60 can be deposited, for example, to a thickness of about 3 to 20 nm by chemical vapor deposition (CVD), plasma enhanced chemical vapor deposition (PECVD), LPCVD, or by atomic layer deposition (ALD). The layers comprising stack 58 can be any suitable multi-layer dielectric-charge trapping-dielectric stack comprising first insulating layer 64, silicon nitride layer 60 overlying first insulating layer 64, and a second insulating layer 62 overlying silicon nitride layer 60. Preferably, second insulating layer 62 comprises a silicon oxide. In an exemplary embodiment of the invention, multi-layer stack 58 has a total thickness that is no greater than about 25 nm. The silicon oxide layers can be deposited, for example, from either a tetraethylorthosilicate (TEOS) or $SiH_4$(silane) source or can be grown thermally from silicon, silicon nitride, or silicon-rich silicon nitride. The silicon nitride or silicon-rich silicon nitride can be deposited, for example, from the reaction of dichlorosilane and ammonia.

Figure 3:
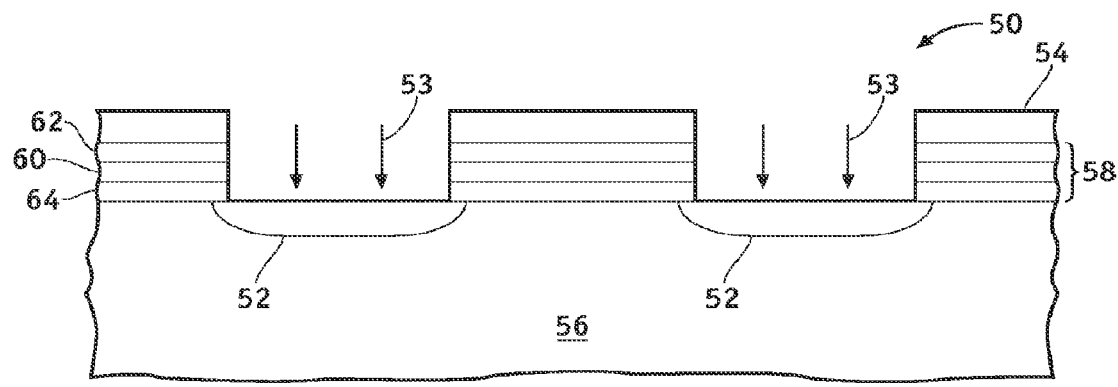

A hard mask layer 54 is formed overlying second insulating layer 62 and is selectively patterned using conventional photolithography methods to expose a surface of second insulating layer 62 that overlies bit line regions 52. Using hard mask layer 54 as an etch mask, second insulating layer 62, charge trapping layer 60; and first insulating layer 64 are etched by an anisotropic etch process(es), as illustrated in FIG. 3.

The hard mask layer 54 then is used as an ion implantation mask and conductivity-determining ions, indicated by arrows 53, are implanted into silicon substrate 56 to form a plurality of spaced-apart bit line regions 52. In a preferred embodiment, semiconductor substrate 56 is impurity doped with P-type and N-type ions such as arsenic ions or phosphorus ions to form N-type bit lines.

Figure 4:
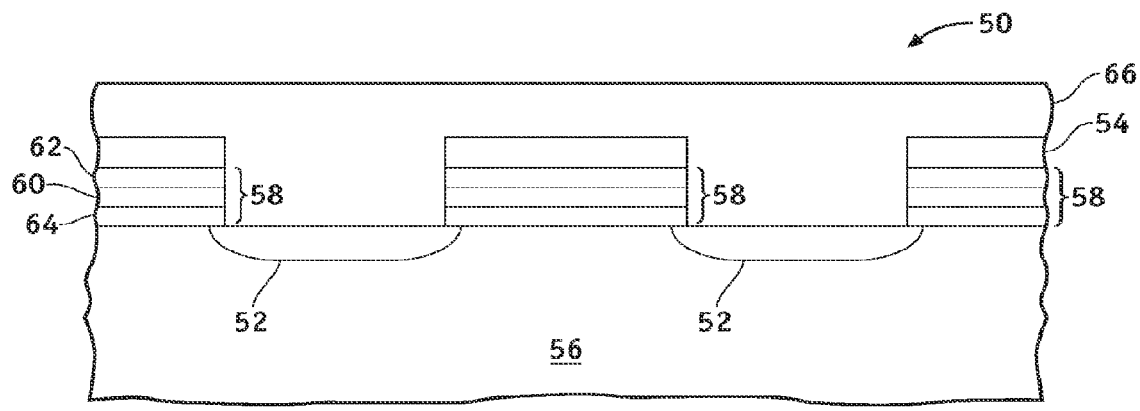
Figure 5:
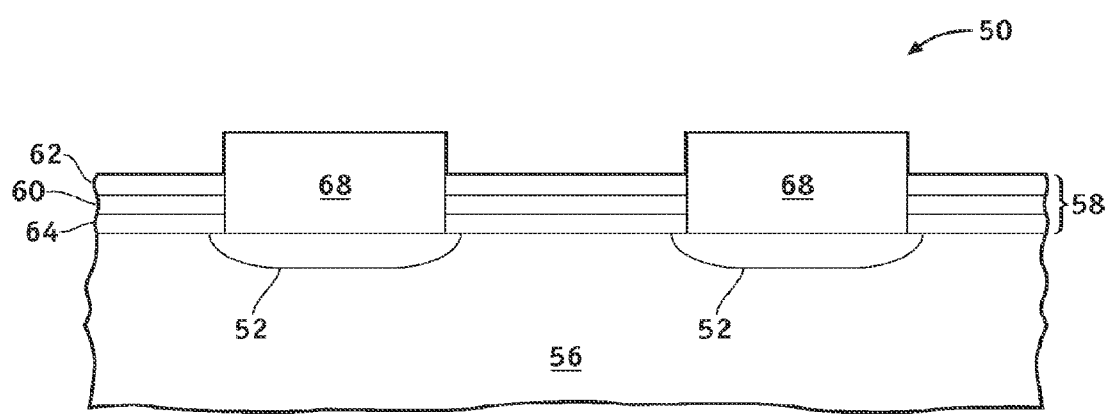

Referring to FIG. 4, the method in accordance with an embodiment of the invention continues by the deposition of a third insulating material 66 overlying the hard mask layer 54 and filling the gaps between the multi-layer stacks 58. The insulating material can be, for example, a deposited silicon oxide, such as a high density plasma (HDP) oxide. Following the deposition, the top surface of insulating material 66 can be planarized by chemical mechanical planarization (CMP) to expose the hard mask layer 54 and to form insulating elements 68 overlying bit line regions 52. In a preferred embodiment of the invention, the CMP process step is followed by an etch step to remove the hard mask layer 54 and to expose the top surfaces of multi-layer stacks 58, as illustrated in FIG. 5.

Figure 6:
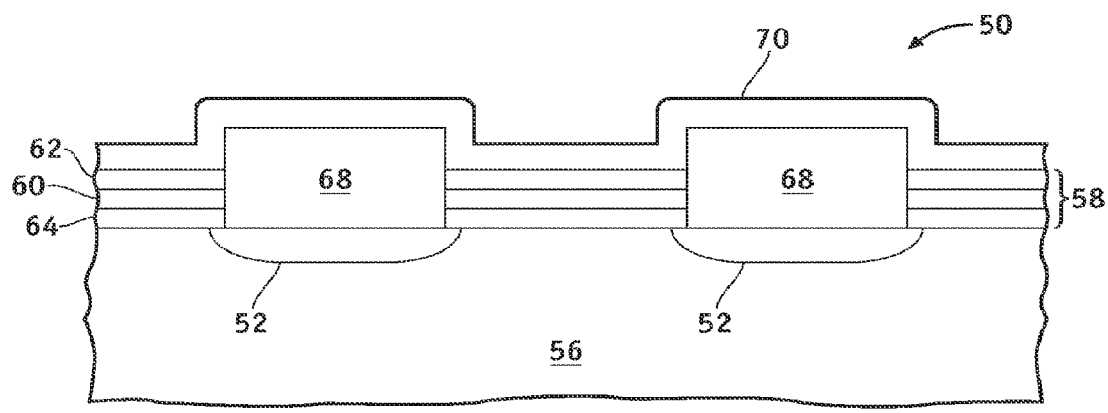
Figure 7:
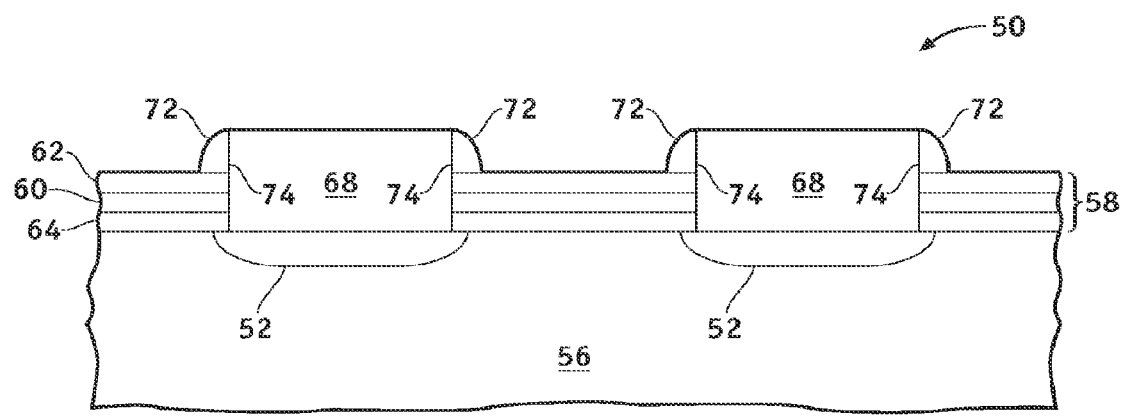
Figure 8:
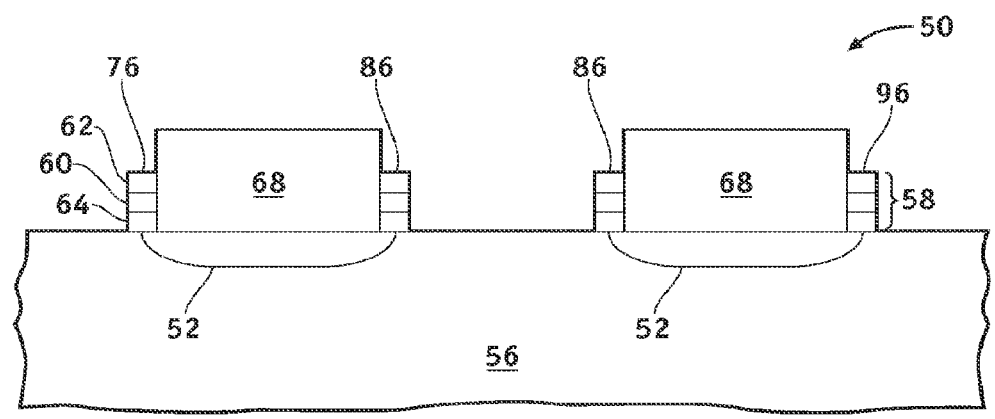

Referring to FIG. 6, a layer 70 of material that has an etch property that is different from that of second insulating layer 62, such as, for example, a silicon nitride, is conformally deposited overlying memory device 50 and is anisotropically etched to form sidewall spacers 72 about the exposed portions of sidewalls 74 of insulating members 68, as illustrated in FIG. 7. Using sidewall spacers 72 as an etch mask, second insulating layer 62, charge trapping layer 60, and first insulating layer 64 of each multi-layer stack are etched by an anisotropic etch process(es), thus exposing substrate 56 and forming two complementary charge storage nodes 76, 86, and 96 from each multi-layer stack between adjacent insulating members 68, as illustrated in FIG. 8. In an exemplary embodiment of the invention, during the etching process sidewall spacers 72 also are substantially removed. If sidewall spacers 72 are not substantially removed during the etching of multi-layer stack 58, they can be removed thereafter.

Figure 9:
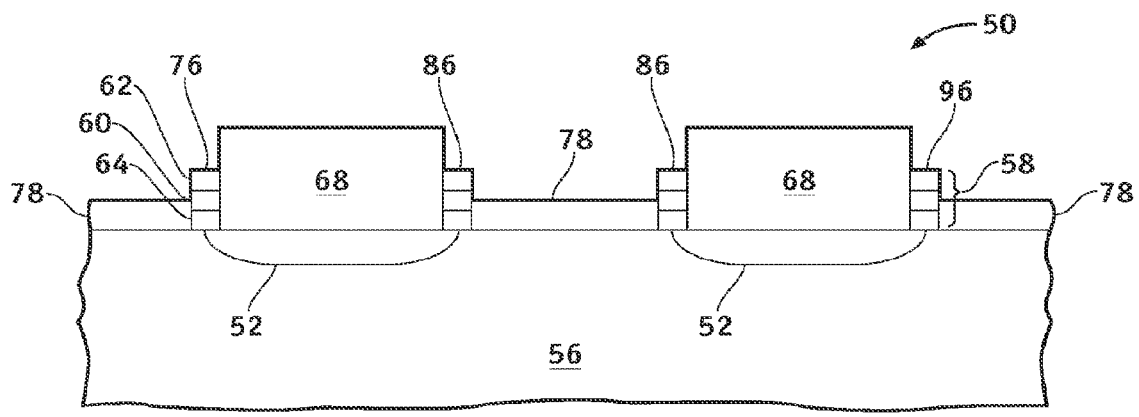

The method in accordance with an embodiment of tee invention continues with the selective epitaxial growth or silicon 78 on the exposed silicon substrate 56 between the two complementary charge storage nodes 76, 86, and 96, as illustrated in FIG. 9. The epitaxial silicon layers can be grown by the reduction of silane (SiH4) or dichlorosilane (SiH2Cl2) in the presence of HCl. The presence of the chlorine source promotes the selective nature of the growth: that is, the growth of the epitaxial silicon preferentially on the exposed silicon surfaces as opposed to on the insulator (silicon oxide or nitride) surfaces. The epitaxial silicon layers grow with crystalline orientation that mimics the crystalline orientation of the silicon material upon which they are grown. In an exemplary embodiment of the present invention, the semiconductor material is grown to a thickness in the range of about 2 to 15 nm.

Figure 10A:
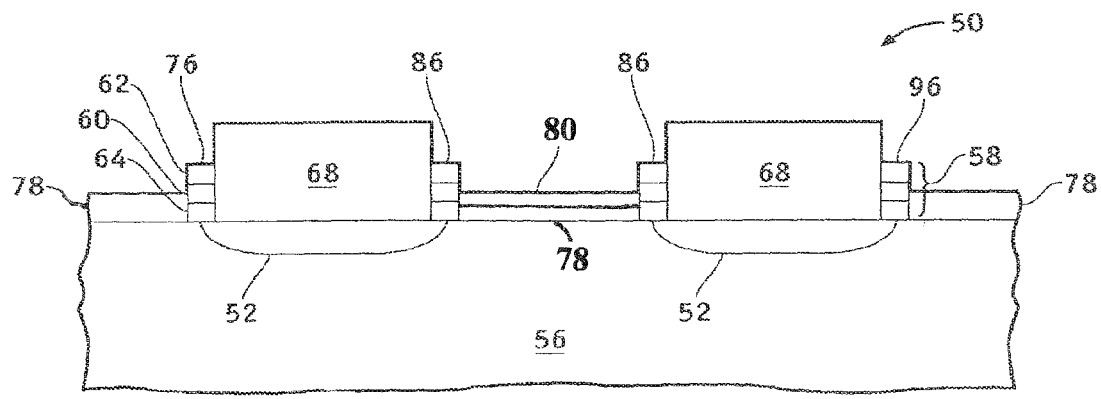
Figure 10B:
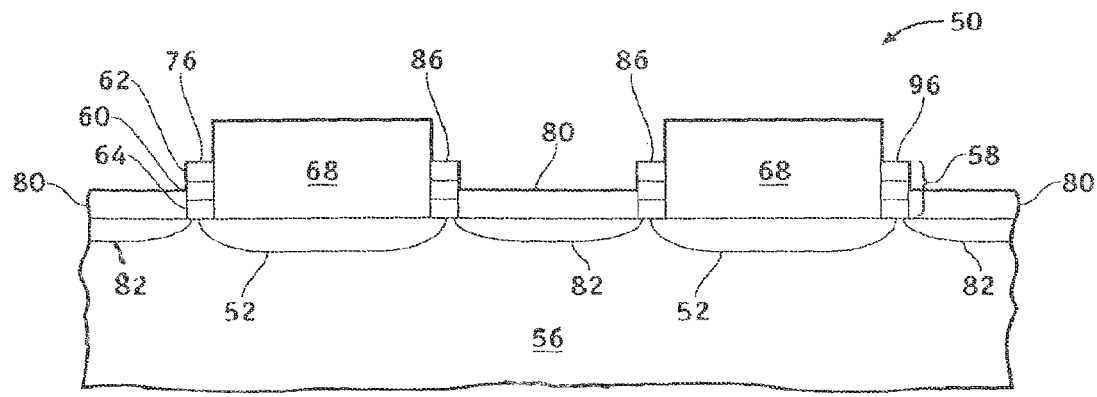

Referring to FIG. 10B, the epitaxially grown semiconductor material 78 then is thermally oxidized to form middle gate regions 80 between the complementary charge storage nodes 76, 86, and 96. Methods for thermally growing a silicon oxide from silicon are well known in the art and will not be discussed further here. In one exemplary embodiment of the invention, illustrated in FIG. 10A, the silicon 78 is partially oxidized (containing an un-oxidized region 78 and an oxidized region 80). In another exemplary embodiment of the invention, illustrated in FIG. 10B, the silicon 78 is substantially fully oxidized. In yet another exemplary embodiment of the invention, illustrated in FIG. 10B, the silicon 78 as well as underlying portions 82 of the silicon substrate 56 are oxidized. As will be appreciated, by epitaxially growing the silicon 78 between the complementary charge storage nodes and subsequently oxidizing the silicon, a middle gate insulator 80 may be formed between the complementary charge storage nodes without increasing the thickness of the tunnel oxide 64.

Figure 11:
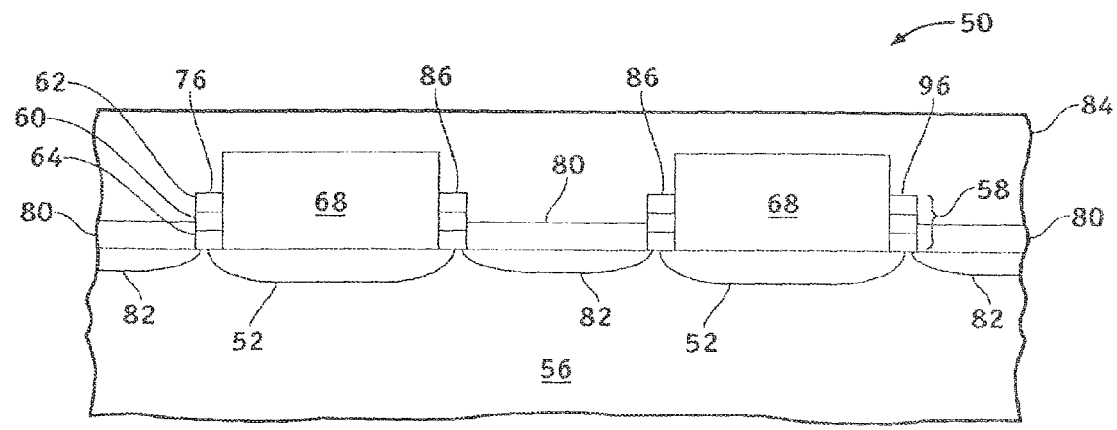

As illustrated in FIG. 11, the method in accordance with one embodiment of the invention is continued by depositing a blanket control gate layer 84 of polycrystalline silicon or other conductive material on the exposed top surfaces of charge storage nodes 76, 86, 96 and middle gate insulator SO. The blanket layer is preferably deposited as an impurity doped layer of polycrystalline silicon or can be deposited as a polycrystalline silicon that is subsequently doped by ion implantation. The control gate layer 84 is patterned and etched to define the control gates.

Those of skill in the art will appreciate that a completed memory device will include isolation such as shallow trench isolation between devices that need to be electrically isolated, electrical contacts to the bit line regions and to the word lines, bit line drivers, word line drivers, clock circuits, address decoding circuits and the like. Fabrication of such structural and circuit elements can be easily integrated with the method for fabricating the memory device structure that has been described herein to fabricate a complete semiconductor memory device.

Accordingly, methods for fabricating dual bit memory devices have been provided. Because the methods provide for the epitaxial growth of silicon between complementary charge storage nodes followed by oxidation of the silicon, middle gate insulators may be formed between complementary charge storage nodes without adverse effects to the tunnel oxide layer. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor memory device comprising:
   a silicon substrate;
   a first insulating element and a second insulating element disposed on the silicon substrate;
   a first bit line region disposed in the silicon substrate underlying the first insulating element and a second bit line region disposed in the silicon substrate underlying the second insulating element;
   a first charge storage node disposed along a sidewall of the first insulating element and a second charge storage node disposed along a sidewall of the second insulating element; wherein a third charge storage node and a fourth charge storage node are disposed along other sidewalls of the first and second insulating elements, respectively, and wherein the first, second, third, and fourth charge storage nodes are each disposed along a portion less than the full height of each respective insulating element sidewall;
   oxidized epitaxially grown silicon disposed on the silicon substrate between the first charge storage node and the second charge storage node, wherein edges of the first and second charge storage nodes contact opposite edges of the oxidized epitaxially grown silicon, wherein a height of the oxidized epitaxially grown silicon isles than a height of the charge storage nodes disposed along respective insulating element sidewalls, wherein the epitaxially grown silicon is substantially all oxidized, and wherein a portion of the silicon substrate underlying the oxidized epitaxially grown silicon is oxidized; and
   a control gate layer contiguously overlying the charge storage nodes, the first and second insulating elements, and the oxidized epitaxially grown silicon.

2. The semiconductor memory device of claim 1, wherein the first charge storage node and the second charge storage node each comprise a layer of silicon-rich silicon nitride.

3. The semiconductor memory device of claim 1, wherein the first charge storage node and the second charge storage node each comprise a layer of one of silicon nitride and polycrystalline silicon.

4. The semiconductor memory device of claim 1, wherein the first charge storage node and the second charge storage node each comprise a layer of a combination of at least two of silicon nitride, silicon-rich silicon nitride, and polycrystalline silicon.

5. The semiconductor memory device of claim 1, wherein the oxidized epitaxially grown silicon is between approximately 2 nm to approximately 15 nm thick.

6. The semiconductor memory device of claim 1, wherein the first and second insulating elements each comprise high density silicon oxide.

7. A semiconductor memory device comprising:
   a silicon substrate;
   a first insulating element and a second insulating element disposed on the silicon substrate;
   a first impurity-doped bit line region disposed in the silicon substrate underlying the first insulating element and a second impurity-doped bit line region disposed in the silicon substrate underlying the second insulating element;
   a first multi-layer charge-trapping stack along a sidewall of the first insulating element and a second multi-layer charge-trapping stack disposed along a sidewall of the second insulating element; wherein a third multi-layer charge-trapping stack and a fourth multi-layer charge-trapping stack are disposed along other sidewalls of the first and second insulating elements, respectively, and wherein the first, second, third, and fourth multi-layer charge-trapping stack are each disposed along a portion less than the full height of each respective insulating element sidewall;
   oxidized epitaxially grown silicon disposed on the silicon substrate between the first multi-layer charge-trapping stack and a second multi-layer charge-trapping stack, wherein edges of the first and second multi-layer charge-trapping stacks contact opposite edges of the oxidized epitaxially grown silicon, wherein the epitaxially grown silicon is substantially all oxidized, and wherein a portion of the silicon substrate underlying the oxidized epitaxially grown silicon is at least partially oxidized; and
   a control gate layer contiguously overlying the multi-layer charge-trapping stacks, the first and second insulating elements, and the oxidized epitaxially grown silicon.

8. The semiconductor memory device of claim 7, wherein the portion of the silicon substrate underlying the epitaxially grown silicon is fully oxidized.

9. The semiconductor memory device of claim 7, wherein the first and second impurity-doped bit line regions are implanted with one of arsenic ions and phosphorous ions.

10. The semiconductor memory device of claim 7, wherein the first and second multi-layer charge-trapping stacks comprise:
- a first insulating layer overlying the silicon substrate;
- a charge trapping layer overlying the first insulating layer; and
- a second insulating layer overlying the charge trapping layer.

11. The semiconductor memory device of claim 10, wherein the charge trapping layer comprises a layer of one of silicon nitride, silicon-rich silicon nitride, and polycrystalline silicon.

12. The semiconductor memory device of claim 10, wherein the charge trapping layer comprises a layer comprising a combination of at least two of silicon nitride, silicon-rich silicon nitride, and polycrystalline silicon.

13. The semiconductor memory device of claim 7, wherein the oxidized epitaxially grown silicon is between approximately 2 nm to approximately 15 nm thick.

* * * * *